United States Patent [19]

Bourez et al.

[11] Patent Number: 5,174,880
[45] Date of Patent: Dec. 29, 1992

[54] MAGNETRON SPUTTER GUN TARGET ASSEMBLY WITH DISTRIBUTED MAGNETIC FIELD

[75] Inventors: Allen J. Bourez; Brij B. Lal, both of San Jose; Atef H. Eltoukhy, Saratoga, all of Calif.

[73] Assignee: HMT Technology Corporation, Fremont, Calif.

[21] Appl. No.: 740,436

[22] Filed: Aug. 5, 1991

[51] Int. Cl.⁵ .............................................. C23C 14/34
[52] U.S. Cl. .......................... 204/298.17; 204/298.19; 204/298.21; 204/192.12
[58] Field of Search ................... 204/298.16, 298.17, 204/298.18, 298.19, 298.20, 298.21, 298.22, 192.12

[56] References Cited

U.S. PATENT DOCUMENTS

| | | | |
|---|---|---|---|
| 4,401,539 | 8/1983 | Abe et al. | 204/298.19 X |
| 4,486,287 | 12/1984 | Fournier | 204/192.12 |
| 4,515,675 | 5/1985 | Kieser et al. | 204/298.19 X |
| 4,572,776 | 2/1986 | Aichert et al. | 204/298.19 X |
| 4,604,180 | 8/1986 | Hirukawa et al. | 204/298.18 |
| 4,933,064 | 6/1990 | Geisler et al. | 204/298.21 X |
| 5,069,772 | 12/1991 | Fritsche et al. | 204/298.19 X |

Primary Examiner—Nam X. Nguyen
Attorney, Agent, or Firm—Peter J. Dehlinger

[57] ABSTRACT

A target assembly is provided having a circular flat target with an inner ring and an outer ring extending from the sputtering surface. A ferromagnetic outer pole member surrounds the target and the outer ring. A ferromagnetic inner pole member is surrounded by the target and the inner ring. A ferromagnetic backing member is positioned against the base surface of the target and has an outer portion positioned against the outer pole member, and an inner portion positioned against the inner pole member. These are positioned relative to the source of the magnetic field for conducting flux in a first path through the outer portion and the outer pole member, across the sputtering surface between the outer and inner rings, and through the inner pole member and inner portion. The backing member further includes a shunt portion intermediate between and magnetically spaced from the inner and outer portions. This shunt portion extends away from the target toward the source of the magnetic field associated with the inner portion for conducting magnetic flux in a second path through a portion of the target intermediate the inner and outer surfaces, and across the sputtering surface toward the outer ring.

4 Claims, 4 Drawing Sheets

MAGNETRON SPUTTER GUN TARGET ASSEMBLY WITH DISTRIBUTED MAGNETIC FIELD

1. FIELD OF THE INVENTION

This invention relates to apparatus for cathode sputtering and particularly to an improved target assembly providing a distributed magnetic field over the target.

2. BACKGROUND OF THE INVENTION

Cathode sputtering is widely used for depositing thin films of material onto substrates. The process involves vaporizing a material by ion bombardment of a target which forms part of a cathode assembly in an evacuated chamber containing an inert gas such as argon. A high voltage electric field is applied between the cathode assembly and an anode in the chamber, and the gas is ionized by collision with electrons ejected from the surface of the cathode. The positive gas ions are attracted to the cathode surface, and atoms of material dislodged when the ions strike the target then traverse the enclosure and deposit as a thin film onto a substrate positioned on a support maintained at or near anode potential.

Although the sputtering process can be carried out solely in an electric field, substantially increased deposition rates are possible with magnetron sputtering in which an arched magnetic field, formed in a closed loop over the surface of the sputtering target, is superimposed on the electric field. The arched closed-loop magnetic field traps electrons in an annular region adjacent to the surface of the target, thereby multiplying the collisions between electrons and gas atoms to produce a corresponding increase in the number of ions in that region.

In the conventional planar target cathode assembly, a flat target plate composed of the material which is to be deposited onto the substrates is clamped in place by nonmagnetic clamping rings positioned radially inside and outside of the target. A magnetic backing plate supports the clamping rings and target and is magnetically coupled to a source of a magnetic field, such as electromagnets or permanent magnets. A magnetic field is produced that arches in the form of a tunnel or closed loop extending along the exposed face of the target. Such a target assembly is shown by Boys in U.S. Pat. No. 4,761,218 entitled "Sputter Coating Source Having Plural Target Rings". With this design, the target is supported on magnet pole lips that extend under inner and outer edges of the base surface of the target.

A drawback of the conventional flat plate target is that erosion occurs in a relatively narrow ring-shaped region corresponding to the shape of the closed-loop magnetic field. The reason for this is that since the path of an electron leaving the target is approximately perpendicular to the surface, it is only the component of the arched magnetic field that is parallel to the surface that produces any deflection of the electron path along the magnetic "tunnel". Over the magnetic poles this parallel component becomes vanishingly small, thereby allowing the electrons to escape from the field. Thus, ionizing efficiency over the poles is very low, and sputtering rates there are correspondingly small. As a result, only the portion of the total target material in the so-called "race track" region is consumed before the target must be replaced. Class et al., in U.S. Pat. No. 4,198,283 entitled "Magnetron Sputtering Target and Cathode Assembly", describes a target assembly utilizing such a conventional type of target.

Another drawback of the conventional annular target, particularly a circular target, is that the flux density near the exposed surface of the target deceases with distance from the center axis of the circular or annular target. Thus, the flux concentration is greater near the inner edge of the target and less near the outer edge. This also contributes to reduced erosion at the outer periphery of the target.

In order to increase the percentage of usable material of a target, the shape of the target has been redesigned to correspond to the actual erosion characteristics during sputtering. Rainey, in U.S. Pat. No. 4,100,055 entitled "Target Profile for Sputtering Apparatus", discloses a target that has increasing thickness with distance from the target center. This accommodates erosion that is greater in the outer perimeter region. The target assemblies show magnetic fields that extend from a pole member adjacent the elevated outer surface of the target to a pole plate supporting the target. This pole arrangement results in magnetic field lines that are parallel to the target surface at only the outer periphery.

Pierce et al., in U.S. Pat. No. 4,385,979 entitled "Target Assemblies of Special Materials for Use in Sputter Coating Apparatus", discloses an improvement on the target assembly design of Rainey. A pole piece is positioned adjacent the inside surface of the target, rather than under the target, producing flux lines that extend further along the target sputtering surface. This results in erosion of the target closer to its center, which is the thickest part of the target.

These prior art approaches have thus been directed to controlling the shape of the target to maximize the yield from the target. There thus remains a need for a target assembly that has a magnetic field that is distributed selectively across the target sputtering surface to produce a desired erosion profile.

There is also a need for a target assembly having a magnetic field that extends generally parallel to the sputtering surface of a target across more of its width in order to distribute the erosion across a greater proportion of the surface.

4. SUMMARY OF THE INVENTION

These features are provided in the present invention by a target assembly that has elevated magnetic poles relative to the target sputtering surface. More specifically, this is provided by a target assembly having an annular sputtering target disposed around a central axis and having a sputtering surface extending transverse of the central axis, an inner surface proximal to the central axis, and an outer surface distal from the central axis. The sputtering surface extends between the inner and outer surfaces. A ferromagnetic outer pole surrounds the target against the outer surface and has an outer extension extending beyond the target surface. This extension is positioned for transmitting magnetic flux above the sputtering surface corresponding to a first magnetic pole from a magnetic flux source. A ferromagnetic inner pole is surrounded by the target against the inner surface. It also has an extension extending beyond the target surface that is positioned for transmitting magnetic flux corresponding to a second magnetic pole. The inner and outer poles produce a flux path extending across the target between the inner and outer extensions.

As another feature of the invention, a target assembly is provided having a distributed magnetic field across the target sputtering surface. The inner and outer poles are structured so that flux exists in a path extending across the target between the inner and outer surfaces. One of the inner and outer poles also extends along a target base surface, opposite from the sputtering surface, intermediate between the inner and outer surfaces for causing the flux associated with the one pole to be distributed over a greater proportion of the sputtering surface than the flux associated with the other pole.

In the preferred embodiment of the invention, a target assembly is provided having a circular sputtering target disposed around a central axis with a generally planar sputtering surface extending transverse of the central axis. An inner surface is proximal to the central axis, an outer surface is distal from the central axis, and a base surface is opposite from the sputtering surface. The target further includes an inner ring and an outer ring, both formed of substantially the same material as the target and positioned to extend from the edges of the sputtering surface.

A ferromagnetic outer pole member surrounds the target against the outer surface and extends along the outer ring beyond the sputtering surface. A ferromagnetic inner pole member is surrounded by the target against the inner surface and extends along the inner ring beyond the sputtering surface.

A ferromagnetic backing member is positioned against the base surface and has an outer portion positioned against the outer pole member and an inner portion positioned against the inner pole member. These are positioned relative to the source of the magnetic field for conducting flux in a first path through the outer portion and the outer pole member, across the sputtering surface between the outer and inner rings, and through the inner pole member and inner portion.

The backing member further includes a shunt portion intermediate between and magnetically spaced from the inner and outer portions. This shunt portion extends away from the target toward the source of the magnetic field associated with the inner portion for conducting magnetic flux in a second path through a portion of the target intermediate the inner and outer surfaces, and across the sputtering surface toward the outer ring.

This embodiment thus provides a generally uniform flux over the sputtering surface as well as a concentrated flux over the outer portion. This flux distribution provides for general erosion across the sputtering face with greater erosion near the outer edge. Sputtering thus takes place over a greater surface area, resulting in more efficient use of the target material, more even sputtering layer deposition on a substrate, and corresponding extended use of each target.

These and other features and advantages of the present invention will be apparent from the following detailed description of the preferred embodiment of the invention, described for purposes of illustration but not limitation, and as illustrated in the accompanying drawings.

DETAILED DESCRIPTION OF THE PRESENT INVENTION

I. Target Assembly

Figure 1:
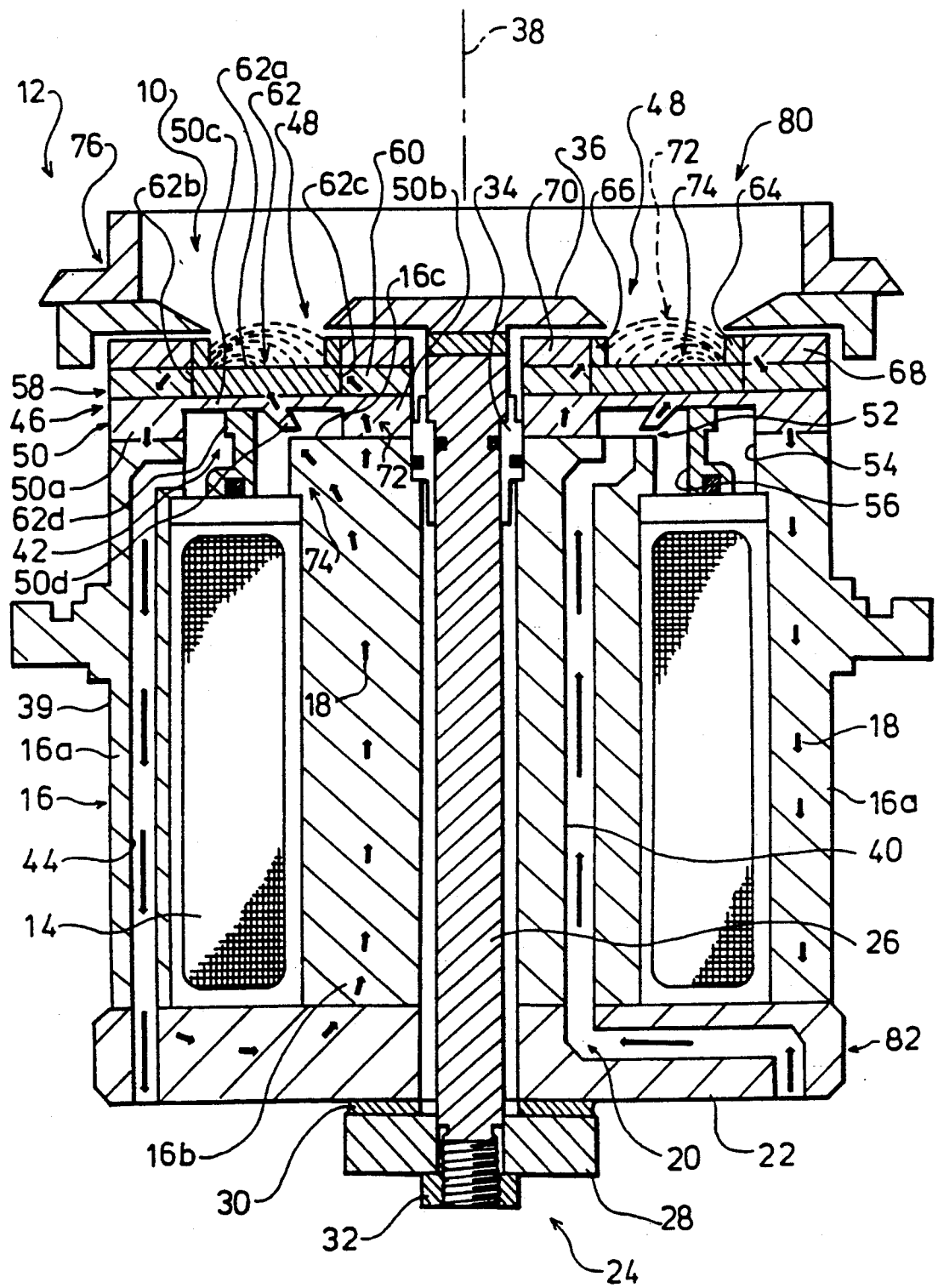
FIG. 1 is a cross section of a sputter cathode assembly incorporating a target assembly constructed according to the invention.

Referring initially to FIG. 1, a target assembly, shown generally at 10, forms part of an otherwise conventional sputter cathode assembly 12. Assembly 12 also includes an electromagnetic coil assembly 14 housed in a pole weldment 16 for conducting flux generally along a path 18 represented by the short dashed arrows, around the coil assembly, when the coil assembly is energized.

The cathode assembly is typically cooled by water traveling in a water channel 20. A rear pole 22 caps the pole weldment and is held in place by an anode assembly 24. Assembly 24 includes an anode post 26 secured with an anode cooler plate 28 and anode insulating washer 30 by a nut 32 threaded onto the end of the anode post, as shown.

An anode insulating seal 34 supports the opposite end of the anode post, which terminates in an exposed circular disk-shaped anode cap 36. The anode post and cap are symmetrical about the target center, represented by axis 38.

Pole weldment 16, driven by coil assembly 14 forms a source 39 of a magnetic field for use with target assembly 10. Magnetic flux of a first direction exists in the outer cylindrical portion 16a of the pole weldment, with the flux path completed by a corresponding smaller-diameter cylindrical inner portion 16b adjacent the anode post. The cathode assembly is cooled by water which travels in channel 20 through an inlet channel 40, around a target-cooling cavity 42 formed in target assembly 10 and pole weldment 16, as shown, and out an outlet channel 44.

The target assembly includes an outer pole means or assembly 46 and an inner pole means or assembly 48. The outer and inner pole assemblies are formed in part by an annular backing plate 50. The backing plate includes a thick circular outer pole portion 50a, a thick circular inner pole portion 50b, and a thin connecting intermediate portion 50c. From about the middle of the intermediate portion 50c and extending downward toward inner pole weldment portion 16b is an annular shunt portion 50d. The top end of pole weldment 16 is planar. The outer pole weldment portion 16a generally conforms to the size of outer pole portion 50a of the backing plate. However, the inner portion of the pole weldment extends outwardly away from axis 38 to a shoulder 16c. Shunt portion 50d extends inwardly toward shoulder 16c, but preferably does not quite touch it.

There is thus a nonferromagnetic portion or gap 52 filled with cooling water in operation. As is also shown, shunt portion 50d also narrows slightly in size toward the pole weldment shoulder. The gap and the shape and size of the shunt portion are used to control the amount of flux conducted through the shunt portion.

There also is an outer cavity 54 and an inner cavity 56, forming cooling cavity 42, of nonferromagnetic material, such as cooling water, between the shunt portion and the outer and inner portions of the backing plate. The forms of gap 52 and cavities 54 and 56 are also used to control the amount and location of flux flow between the inner portion of the pole weldment and the inner and shunt portions of the backing plate.

On top of outer portion 50a of the backing plate is an outer annular ferromagnetic ring spacer or clamp 58. A corresponding ferromagnetic ring spacer or clamp 60 is positioned on top of inner portion 50b of the backing plate. These clamps secure a circular target plate 62. The target plate has an upper (as shown in the figure) exposed or sputtering surface 62a, an outer surface 62b positioned against clamp 58, and inner surface 62c positioned against clamp 60, and a base surface 62d supported on intermediate portion 50c of the backing plate.

Extending beyond the sputtering surface of the target plate is an outer annular projection or ring 64 adjacent the outer surface, and an inner annular ring 66 adjacent the inner surface. These rings, along with the target plate are made of a conventional sputtering target material, such as a CoCrTa magnetic alloy, and form the sputtering target.

Rings 64 and 66 are held in place by an outer annular clamp 68 and an inner annular clamp 70, respectively. The outer pole assembly is thus formed of backing plate outer portion 50a, outer target clamp 58 and outer ring clamp 68. These components are formed of a suitable ferromagnetic material, such as 410 stainless steel, which is relatively opaque to magnetic flux lines from the magnetic poles in assembly.

The inner pole assembly provides for flux conduction along a first path 72 formed by backing-plate inner portion 50b, inner target clamp 60, and inner ring clamp 70, all also formed of a suitable ferromagnetic material, such as 410 stainless steel. The inner and outer ring clamps thus form extensions of the pole assemblies and the target rings 64 and 66 thereby define outer and inner target poles.

Flux conduction is also along a second path 74 formed by backing-plate shunt portion 50d and shunt gap 52. Clearly the distribution of flux across the surface of the target plate can readily be controlled as desired by appropriate selection of the size and magnetic-characteristic makeup of the shunt portion of the second flux path.

Figure 2A:
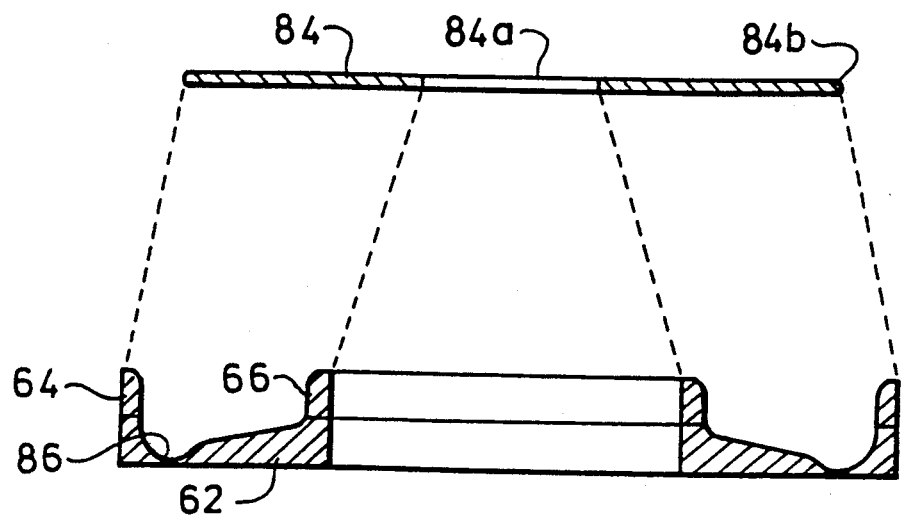
FIGS. 2A and 2B are cross sections of a target in the sputtering assembly of the present invention (2A), and in a conventional target assembly (2B), both near the end of target usage.

Finally, a conventional ground shield 76 extends circumferentially around the target assembly adjacent the outer ring clamps, as shown. The target assembly just described is contained within an enclosed chamber 80 in a sputtering apparatus, indicated generally at 82. Also carried in the chamber, and shown in FIG. 2A, is a disc substrate 84 which is positioned "above" the assembly for sputter deposition from the target, as described below. A similar target assembly may be positioned on the upper side of the substrate for sputtering a desired film onto the upper side of the substrate during a sputter operation. Each substrate, such as substrate 84, has an inner diameter edge 84a, and an outer diameter edge 84b, between which is the planar substrate surface on which material is deposited during sputtering. A typical substrate for a thin-film medium has an inner diameter of 25 mm, and an outer diameter of 95 mm.

II. Operating Characteristics

In operation, the chamber housing of the target assembly in the above sputtering device is evacuated, and an inert sputtering gas, such as argon, is introduced into the chamber to a final pressure of between about 2-20 mTorr typically. A voltage applied across the anode and cathode of the assembly produces electron collisions with the chamber gas which create positive ions formed between the two electrons. These ions, in the form of a sustained plasma, impact the target surface, ejecting target atoms which are then deposited on the confronting surface of the substrate.

As indicated above, the target assembly of the present invention functions to concentrate the magnetic field lines across the two poles, and indicated in FIG. 1 at 72 in the region formed immediately above target surface 62b, between the two target rings 64, 66. That is, the magnetic field lines are concentrated closer to the plane of the target surface, in directions more parallel to the target surface, than in a conventional target configurations, where the magnetic field lines are more arched and distant from the target surface.

This greater magnetic field concentration is due to two features of the invention. First, the raised ring-and-clamp structure, involving rings 64, 66 and the associated clamps 58, 60, acts to direct the magnetic field lines directly across the target surface, rather than normal to this surface, at the poles. Secondly, because the clamp structure in the assembly is relatively ferromagnetic (by virtue of its iron content in the present embodiment), the clamp acts as an extension of the magnetic poles, serving to divert the pole magnetic field lines (which are normal to the pole surfaces) between the raised clamps.

According to another feature of the invention, the magnetic-field shunt in the assembly creates, in effect, a split magnetic pole, the inner main pole of which acts to focus magnetic lines 72 across the entire target surface, between the raised target regions, and a secondary intermediate pole acting to drawing magnetic lines, such as indicated at 74 in FIG. 1, between the outer and center regions of the target surface. As a result, the plasma produced during sputtering is more evenly distributed across the target surface, with the advantages, in a sputtering operation, now to be described.

In the operations described below, sputtering was carried out using a Circuits Processing Sputtering Apparatus (Fremont, Calif.), representative of a double-sided, in-line, high-throughput machine having two interlocking systems, for loading and unloading. The cathode in the apparatus was modified according the present invention, as detailed in Section I. For comparative purposes, performance characteristics of the unmodified apparatus were also determined. In both cases, the sputtering chamber was evacuated to pressure of about $10^{-7}$ torr, and argon gas was introduced into the chamber to a final sputtering pressure of up to 20 mTorr. The sputtering target was a cobalt target obtained from Hitachi Metals (Japan).

Figure 3:
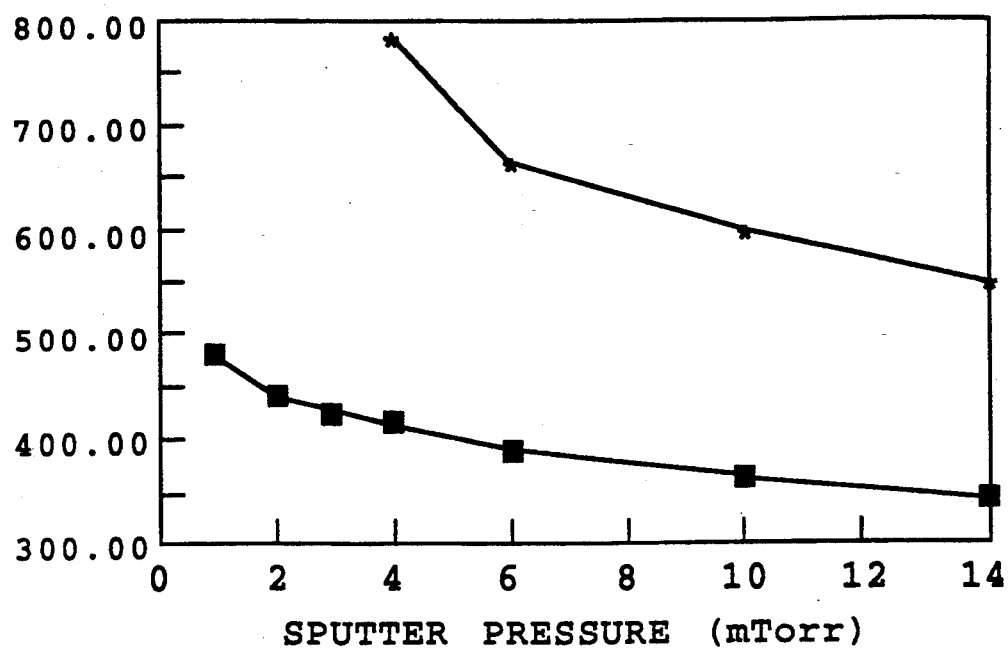
FIG. 3 shows plots of sputter pressure versus target voltage required for plasma ignition in the assembly of the present invention (solid rectangles) and in a conventional target assembly (crosses)

One measure of sputtering efficiency is the plasma voltage required to ignite the sputtering plasma, at a given chamber gas pressure. FIG. 3 shows plots of target voltage (in volts) versus argon pressure in the sputtering chamber at which plasma ignition is achieved. As seen, plasma ignition was achieved at an argon pressure as low as 1 mTorr, at a voltage of about 475 volts in the present invention (closed rectangles). At a pressure of 14 mTorr, the plasma ignition voltage was down to 350 volts. By contrast, plasma ignition in a conventional target (crosses) was first seen at 4 mTorr, and only at maximum voltage (near 800 volts). Even at 14 mTorr, the plasma ignition voltage was still higher than 500 volts.

Figure 4:
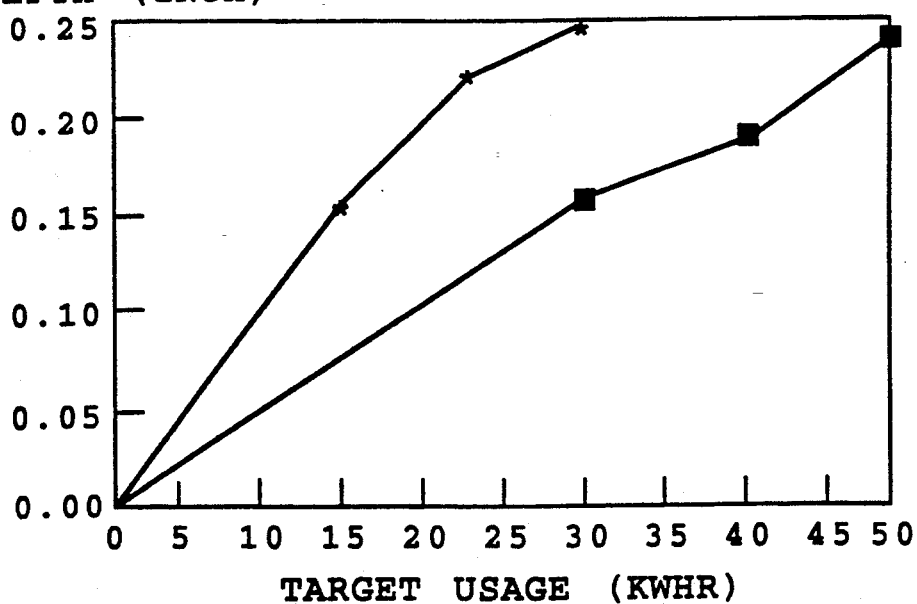
FIG. 4 is a plot of target erosion depth, as a function of target usage time, for a target in the sputtering assembly of the present invention (solid rectangles), and in a conventional target assembly (crosses)

Another important advantage of the present invention is greater target utilization, seen in FIGS. 2 and 4. FIG. 2A shows the cross-sectional profile of target 62 and target rings 64, 66 after about 50 kilowatt hours (KWH) of target use, and near the final stage of use. The profile shows erosion of material over the entire surface of the target, producing a shallow asymmetrical valley 86 which is centered near the outer region of the target. Some depletion of material is also seen in the raised ring portions of the target.

Figure 2B:
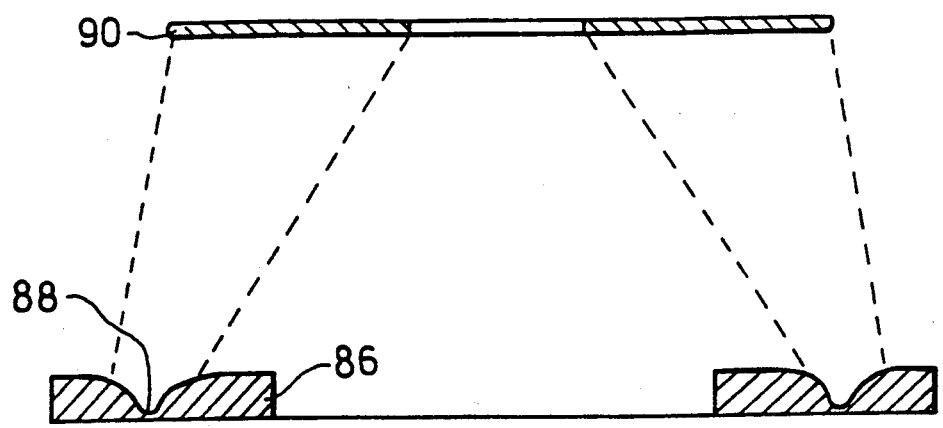

FIG. 2B shows the target profile after 30 KWH of use in a conventional target assembly. Here erosion of a target 86 is concentrated in a relatively narrow center region 88 of the target, forming a steep valley of eroded material, but leaving much of the target surface without any significant erosion.

FIG. 4 plots the erosion depth in a target, as a function of sputtering time (in KWH) for target erosion in a convention target assembly (crosses) and the assembly of the present invention. The total usage time of the target is increased from about 30 KWH in a conventional assembly to about 50 KWH in the present invention.

The broader area of target sputtering, and the shallower erosion profile achieved in the present invention also contributes to more uniform film-thickness deposition on a substrate surface. This feature can be appreciated from the sputtering diagrams in FIGS. 2A and 2B. In FIG. 2A, sputtered material (dotted lines) is shown being ejected across the entire target surface, including the raised target surface, onto the overhead portion of substrate 84. As indicated in the figure, this broad area of sputtered (ejected) target atoms material creates a relatively uniform deposition angle from the target across the entire substrate surface, i.e., between inner and outer edges 84a and 84b.

FIG. 2B illustrates the deposition of target material onto a substrate 90. As noted above, target deposition is confined to a relatively narrow ring in the target center region, and this produce a greater range of sputtering angle onto substrate 90 than in the present invention. Furthermore, as target erosion occurs, increasing sputtering occurs from the sides of the erosion valley, causing greater asymmetry (nonuniformity) in the sputtering angles directed against the target.

Figure 5:
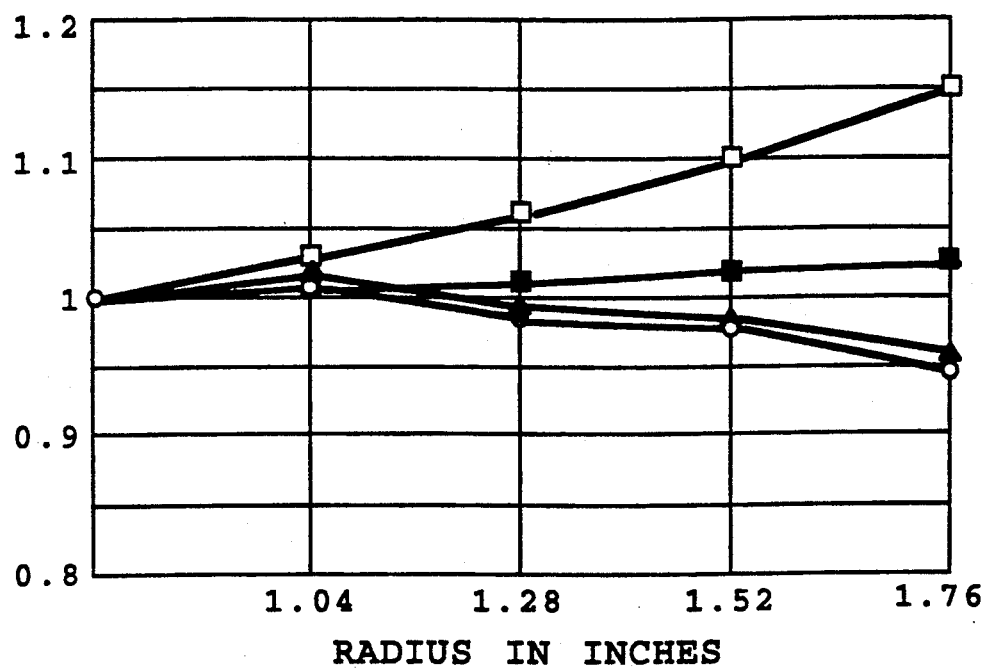
FIG. 5 shows plots of magnetic film thickness, from inner to outer-diameter regions of a magnetic disc, for films formed in the sputtering assembly of the present invention at early and late target usage times (solid triangles and open diamonds, respectively) and in a conventional sputtering assembly at early and late target usage times (solid rectangles and open rectangles, respectively).

FIG. 5 plots the variations in sputtered film thickness between inner and outer diameter regions of a substrate, under various sputtering conditions. The films indicated by solid rectangles and open squares were formed by a conventional sputter-target configuration, at 1.5 KWH and 25 KWH sputtering times, i.e., near the beginning and the end of a target lifetime, respectively. As the target is eroded, film thickness uniformity is compromised substantially. The films indicated by solid triangles and open diamonds, were produced at target times of about 1.5 and 48 KWH, respectively, in a sputtering cathode assembly constructed according to the present invention. At both target extremes, substantially uniform film thickness was achieved between inner and outer substrate edges.

From the foregoing, it will be appreciated how various objects and features of the invention are met. The assembly, by producing a selected, more uniform and more concentrated magnetic field pattern in the region of the sputtering target, increases target lifetime, and increases uniformity of sputtered film, over the life of a target. In addition, plasma ignition for sputtering occurs at lower pressures and voltages, increasing the pressure and voltage regions which can be varied in the sputtering process, for achieving desired film deposition rates and film properties.

It will be appreciated that various structural modifications may be made to achieve different selected erosion patterns and characteristics by varying the size, shape, magnetic characteristics and position of the shunt portion of the inner pole assembly.

It will therefore be apparent to one skilled in the art that variations in form and detail may be made in the preferred embodiment without varying from the spirit and scope of the invention as defined in the claims. The preferred embodiment is thus provided for purposes of explanation and illustration, but not limitation.

It is claimed:

1. A target assembly for use in a magnetron sputtering apparatus having a source of a magnetic flux, the target assembly comprising:

an annular sputtering target disposed around a central axis and having a sputtering surface extending transverse of the central axis, an inner surface proximal to the central axis, and an outer surface distal from the central axis, the sputtering surface extending between the inner and outer surfaces;

ferromagnetic outer pole means surrounding the target against the outer surface, having an outer extension extending beyond the target sputtering surface, and positioned for conducting magnetic flux corresponding to a first magnetic pole from the magnetic flux source;

ferromagnetic inner pole means surrounded by the target against the inner surface, having an inner extension extending beyond the target sputtering surface, and being positioned for conducting magnetic flux corresponding to a second magnetic pole from the magnetic flux source;

the inner and outer pole means producing a flux path extending across the target between the inner and outer extensions; and a shunt portion included in one of the inner and outer pole means extending toward the target opposite from the sputtering surface for conducting a portion of magnetic flux associated with one of the inner and outer pole means in a second flux path extending through a portion of the target intermediate the inner and outer surfaces to the extension of the other of the inner pole means and the outer pole means.

2. A target assembly according to claim 1 wherein the target further comprises a ring formed of substantially the same material as the target and extending from the target surface adjacent one of the inner and outer surfaces.

3. A target assembly according to claim 1 further comprising an inner ring and an outer ring, both formed of substantially the same material as the target and extending from the target surface, the inner ring being positioned adjacent the inner surface and the outer ring being positioned adjacent the outer surface.

4. A target assembly for use in a magnetron sputtering apparatus having a source of a magnetic field, the target assembly comprising:

an annular sputtering target disposed around a central axis and having a generally planar sputtering surface extending transverse of the central axis, an inner surface proximal to the central axis, an outer surface distal from the central axis, the sputtering surface extending between the inner and outer surfaces, and a base surface opposite from the sputtering surface, the target further including an inner ring and an outer ring, both formed of substantially the same material as the target and extending from the sputtering surface, the inner ring being positioned adjacent the inner surface and the outer ring being positioned adjacent the outer surface;

a ferromagnetic outer pole member surrounding the target against the outer surface and extending along the outer ring beyond the sputtering surface;

a ferromagnetic inner pole member surrounded by the target against the inner surface and extending along the inner ring beyond the sputtering surface; and a ferromagnetic backing member positioned against the base surface and having an outer portion positioned against the outer pole member, and an inner portion positioned against the inner pole member, the inner and outer portions being positioned relative to the source of the magnetic field for conducting flux in a first path through the outer portion and the outer pole member, across the sputtering surface between the outer and inner rings, and through the inner pole member and inner portion, the backing member further including a shunt portion positioned between and magnetically spaced from the inner and outer portions and extending from the target toward the source of the magnetic field associated with the inner portion for conducting magnetic flux in a second path through a portion of the target intermediate the inner and outer surfaces, and across the sputtering surface toward the outer ring.

* * * * *